(12) United States Patent
Singh

(10) Patent No.: US 7,955,649 B2
(45) Date of Patent: Jun. 7, 2011

(54) FORMING THIN FILMS USING A RESEALABLE VIAL CARRIER OF AMPHIPHILIC MOLECULES

(75) Inventor: Brij Pal Singh, North Royalton, OH (US)

(73) Assignee: Visichem Technology, Ltd., North Royalton, OH (US)

( * ) Notice: Subject to any disclaimer, the term of this patent is extended or adjusted under 35 U.S.C. 154(b) by 664 days.

(21) Appl. No.: 12/014,933

(22) Filed: Jan. 16, 2008

(65) Prior Publication Data
US 2008/0171147 A1    Jul. 17, 2008

Related U.S. Application Data

(60) Provisional application No. 60/880,911, filed on Jan. 17, 2007.

(51) Int. Cl.
*C23C 16/455* (2006.01)
(52) U.S. Cl. .................. 427/248.1; 427/255.23; 427/294
(58) Field of Classification Search ............... 427/248.1, 427/255.23, 294
See application file for complete search history.

(56) References Cited

U.S. PATENT DOCUMENTS

| | | | |
|---|---|---|---|
| 3,984,267 A * | 10/1976 | Craford et al. ................ | 438/568 |
| 4,539,061 A | 9/1985 | Sagiv | |
| 5,078,791 A | 1/1992 | Singh et al. | |
| 5,106,561 A | 4/1992 | Singh et al. | |
| 5,166,000 A | 11/1992 | Singh et al. | |
| 5,173,365 A | 12/1992 | Singh et al. | |
| 5,204,126 A | 4/1993 | Singh et al. | |
| 5,219,654 A | 6/1993 | Singh et al. | |
| 5,300,561 A | 4/1994 | Singh et al. | |
| 5,412,052 A | 5/1995 | Ahmed et al. | |
| 5,422,223 A | 6/1995 | Sachdev et al. | |
| 5,542,575 A * | 8/1996 | Stark et al. .................... | 220/348 |
| 5,589,562 A | 12/1996 | Lichtenhan et al. | |
| 5,691,396 A | 11/1997 | Takemura et al. | |
| 6,003,702 A * | 12/1999 | Grimard et al. ............... | 215/307 |
| 6,057,042 A | 5/2000 | Shimotsu | |
| 6,171,652 B1 | 1/2001 | Singh et al. | |
| 6,172,652 B1 * | 1/2001 | Plonka ......................... | 343/853 |
| 6,206,191 B1 * | 3/2001 | Singh et al. ................. | 206/524.1 |

(Continued)

OTHER PUBLICATIONS

Fu, Qiang, et al., "ZnO thin films deposited by a CVT technique in closed ampoules". Materials Letters 63 (2009) pp. 316-318.*

(Continued)

*Primary Examiner* — Bret Chen
(74) *Attorney, Agent, or Firm* — Fay Sharpe LLP

(57) ABSTRACT

A method of forming a thin film of amphiphilic molecules on a substrate by using a resealable vial carrier is provided. The method includes placing the substrate in a vacuum chamber. A resealable cap member of the vial carrier is opened. The vial carrier may contain a liquid or solid amphiphilic material. The open vial carrier is placed within the chamber. The chamber is sealed and a pressure from about $2 \times 10^{+2}$ to $5 \times 10^{-6}$ torr is applied to the chamber. The vial carrier is heated to a temperature between 100-350° C. The amphiphilic material is vaporized in the chamber. A thin film of amphiphilic molecules is formed on the substrate. The chamber is opened and the substrate having the thin film of amphiphilic molecules thereon is removed. The resealable vial carrier includes a temperature resilient vial carrier and a resealable member selectively disposed about an opening of the vial carrier. The vial carrier contains a heat vaporizable amphiphilic material for direct use in forming a thin film coating on a substrate in a vacuum chamber.

24 Claims, 3 Drawing Sheets

U.S. PATENT DOCUMENTS

| | | | |
|---|---|---|---|
| 6,284,908 B1 | 9/2001 | Loy et al. | |
| 6,340,734 B1 | 1/2002 | Lin et al. | |
| 6,604,561 B2* | 8/2003 | Py | 141/329 |
| 6,652,644 B1* | 11/2003 | Miller et al. | 117/2 |
| 6,682,518 B1* | 1/2004 | Rothstein | 604/415 |
| 6,881,445 B1 | 4/2005 | Arora | |
| 6,905,541 B2* | 6/2005 | Chen et al. | 117/86 |
| 6,921,062 B2* | 7/2005 | Gregg et al. | 261/23.1 |

OTHER PUBLICATIONS

W.C. Bigelow et al., "Oleophobic Monolayers, Films Adsorbed From Solution In Non-Polar Liquids", J. Colloid. Sci., 1, 513-538 (1946).

L.H. Lee, "Wettability and Conformation of Reactive Polysiloxanes", J. Colloid. & Interface Sci., 27, 751-760 (1968).

E.E. Polymeropoulos et al., "Electrical Conduction Through Adsorbed Monolayers", J. Chem Phys., 69, 1836-1847 (1978).

Feher et al., "Enhanced Silylation Reactivity of a Model for Silica Surfaces", J. Am. Chem. Soc., 112, 1931-1936 (1990).

Shea et al., "Arylsilsesquioxane Gels and Related Materials. New Hybrids of Organic and Inorganic Networks", J. Am. Chem. Soc., 114, 6700-6710 (1992).

Parikh et al., "$n$-Alkylsiloxanes: From Single Monolayers to Layered Crystals. The Formation of Crystalline Polymers from the Hydrolysis of $n$-Octadecyltrichlorosilane", J. Am. Chem. Soc., 119, 3135-3143 (1997).

Baney et al., "Silsesquioxanes", Chem. Rev., 95, 1409-1430 (1995).

* cited by examiner

FORMING THIN FILMS USING A RESEALABLE VIAL CARRIER OF AMPHIPHILIC MOLECULES

A claim for domestic priority is made herein under 35 U.S.C. §119(e) to U.S. Provisional App. Ser. No. 60/880,911 filed on Jan. 17, 2007, the entire disclosure of which is incorporated herein by reference.

BACKGROUND

Generally, the present invention relates to thin film formation on substrates. In particular, the present invention relates to forming a highly uniform and continous thin film on a substrate using a resealable vial carrier containing thin film forming amphiphilic material.

Hydrolyzable alkyl silanes and polymeric amphiphilic molecules having intrinsic ability to self-assemble in a thin film are used to form thin films on various substrates such as glass, metals, plastics and anti-reflective surfaces. These thin films have been used to render different properties on the substrate surface, such as easy clean, water repellent, non-stick, chemical and corrosion resistance properties. Forming a durable thin film of amphiphilic molecules directly on the plastic surface, such as plastic lens, is difficult. So a metal oxide such as silicon dioxide "silica" layer is initially applied on plastic lenses, inside a high vacuum chamber under anhydrous conditions and then the thin film of amphiphilic material is applied.

In general, most of the plastic lenses coated with anti-reflective (AR) film have a last layer as silica. The silica coated lens is then exposed to water vapors in the clean ambient air to hydrolyze the silica surface, converting —$SiO_2$ to —Si—OH bonds. The —Si—OH bonds on the silica surface enhance strong adhesion between amphiphilic molecules and the lens surface. The silica coated hydrolyzed lenses are then put in a second low vacuum chamber for deposition of thin film of hydrolyzable amphiphilic molecules. Coating the thin film of hydrolyzable amphiphilic molecules in the first high vacuum chamber creates contamination and corrosion inside the chamber. Thus, the vacuum chamber cannot be used again for AR film coating until it is thoroughly cleaned.

Hydrolyzable amphiphilic molecules such as chlorosilanes have been used in solution to form thin films on substrates. By way of example, description of such materials and their ability to form thin films are contained in: W. C. Bigelow et al, J. Colloid. Sci., 1, 513-538(1946); L. H. Lee, J. Colloid. & interface Sci., 27,751-760 (1968); E. E. Polymeropoulos et al. J. Chem. Phys., 69, 1836-1847, (1978); and U.S. Pat. Nos. 4,539,061; 5,078,791; 5,106,561; 5,166,000; 5,173,365; 5,204,126; 5,219,654 and 5,300,561, the disclosures of which are hereby incorporated herein by reference.

Typically, the hydrolyzable amphiphilic material is dissolved in a solvent and the substrate to be coated is brought in contact with the solution for a period of time. After adequate exposure, the substrate is cleaned with water and soap solution. Forming the thin film in this manner has certain problems. For example, the solvent is toxic and may also evaporate into the air creating a flammable hazard. Also, the amphiphilic molecules in solution may hydrolyze due to exposure to air borne moisture, which creates hydrochloric acid as a by-product. This poses additional health hazards to the operator. Also, the used old solution of amphiphilic molecules needs to be disposed off according to local and federal regulations. Thus, there can be substantial environmental, health and waste disposal issues with this prior art method.

Another method to form a thin film of amphiphilic molecules on a substrate involves using a rupturable glass ampoule to deliver the liquid amphiphilic material in a vacuum chamber and coat the substrate surface. This method has been described in U.S. Pat. Nos. 6,171,652 and 6,206,191, which are hereby incorporated by reference. According to the method, a vapor phase coating process is used. A sealed glass ampoule containing a thin film forming liquid amphiphilic material is placed inside a low vacuum chamber together with the substrate to be coated. According to this process, as vacuum is established inside the chamber, the glass ampoule is broken open via a mechanical device in the chamber and the amphiphilic material is vaporized by heating. The vaporized amphiphilic material then proceeds to form a thin film on the substrate. The coated lenses are then removed from the chamber and the empty broken glass ampoule is discarded.

Although the sealed frangible ampoule serves as a good carrier to charge the vacuum chamber with a liquid thin film forming material, several problems still exist with its use. First, when the frangible ampoule is broken open, glass fragments can scatter throughout the chamber potentially impinging upon or otherwise causing damage to the substrate. This is caused by the pressure difference between the inside of the ampoule and the vacuum chamber. Second, when the ampoule breaks open with high force as previously described, the contents of the ampoule tend to suddenly spurt out. This leads to a non-uniform film on the substrate including spots and drops of film forming material on the substrate. This requires the coated substrate to be inspected and often cleaned as a result. Third, since a mechanical device inside the chamber is used to break open the ampoule, corrosion and mechanical failure of the mechanical device can cause the ampoule not to break open properly. This can result in the film forming material not being released in the chamber, and no coating on the substrate. This results in lost time and decreased production. Accordingly, such ampoule carriers are not reliable dispensing devices. Also, since the process uses a low vacuum chamber, solid thin film forming polymeric amphiphilic materials cannot be used in the sealed ampoule that requires very high vacuum to vaporize. As such, the sealed ampoule is not a versatile carrier.

Another recent development to deliver solid polymeric amphiphilic materials, such as the polyhedral oligomeric silsesquioxanes (POSS), is described in U.S. Pat. No. 6,881,445 and is hereby incorporated herein by reference. A porous metal carrier (e.g. a tablet) is impregnated with the thin film forming solid material and placed in side the high vacuum chamber together with the substrate to be coated. After the desired level of vacuum is achieved, the porous carrier is heated at high temperature to evaporate the solid amphiphilic material in the chamber thereby coating the substrate.

As described, the porous carrier may work but it still has certain limitations and disadvantages. First, the porous carrier is not suitable for thin film forming moisture sensitive amphiphilic molecules such as hydrolyzable chlorosilane liquids. As the porous carrier is exposed to air during use, the amphiphilic molecules hydrolyze, thereby giving off toxic by-product and poor quality film on the substrate. Also, holding a liquid in the pores of a porous carrier is difficult or impractical since the liquid tends to leak or flow out of the pores of the porous carrier. As such, only semi-solid or solid amphiphilic materials can be used to impregnate the porous carrier. Second, impregnating solid polymeric amphiphilic materials into porous carrier requires solvents that are highly volatile and toxic to the worker. Preparing the porous composite also requires heating at high temperature and or vacuum distillation. The porous carrier composite, as defined, does not have the versatility to be used reliably with liquid amphiphilic materials in a low vacuum chamber.

It is therefore an objective of the present invention to provide an improved thin film coating method using a more reliable, versatile and safer dispensing system (material carrier) containing thin film forming amphiphilic materials.

SUMMARY

According to one aspect of the present invention, a method of forming a thin film of amphiphilic molecules on a substrate by using a resealable vial carrier is provided. The method includes placing the substrate in a vacuum chamber. A resealable cap member of the vial carrier is opened. The vial carrier contains a liquid amphiphilic material. The open vial carrier is placed within the chamber. The chamber is sealed and at least a pressure from about $2 \times 10^{+2}$ to $5 \times 10^{-4}$ torr is applied to the chamber. The vial carrier is heated to a temperature between 100-350° C. The amphiphilic material is vaporized in the chamber. A thin film of amphiphilic molecules is formed on the substrate. The chamber is opened and the substrate having the thin film of amphiphilic molecules thereon is removed.

According to another aspect of the present invention, a method of forming a thin film of amphiphilic molecules on a substrate by using a resealable vial carrier is provided. The method includes placing the substrate in a high vacuum chamber. A resealable cap member of the vial carrier is opened containing a solid polymeric amphiphilic material. The open vial carrier is placed within the chamber and the chamber is sealed. A metal oxide (silica) coating is formed on the substrate in the chamber. After the metal oxide coating a pressure from about $2 \times 10^{+2}$ to $2 \times 10^{-6}$ torr is applied to the chamber. The vial carrier is heated to a temperature between 100-350° C. The solid amphiphilic material is vaporized in the chamber. A thin film of amphiphilic molecules is formed on the substrate. The chamber is opened and the substrate having the thin film of amphiphilic molecules thereon is removed.

According to yet another aspect of the present invention, a resealable vial carrier is provided. The resealable vial carrier includes a temperature resilient vial carrier and a resealable member selectively disposed about an opening of the vial carrier. The vial carrier contains a heat vaporizable amphiphilic material for direct use in forming a thin film coating on a substrate in a vacuum chamber.

DETAILED DESCRIPTION

Figure 1:
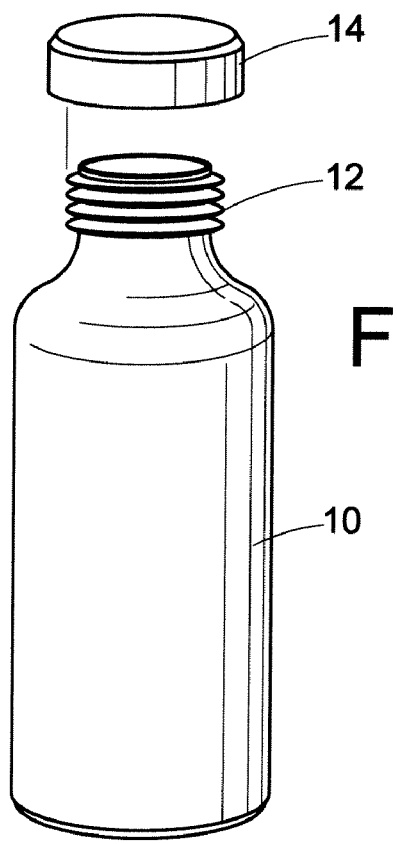
FIG. 1 is a perspective view of a first embodiment of a resealable container or vial carrier for use in a method of thin film formation, according to the present invention, having a threaded neck portion and a threaded sealing cap.
Figure 2:
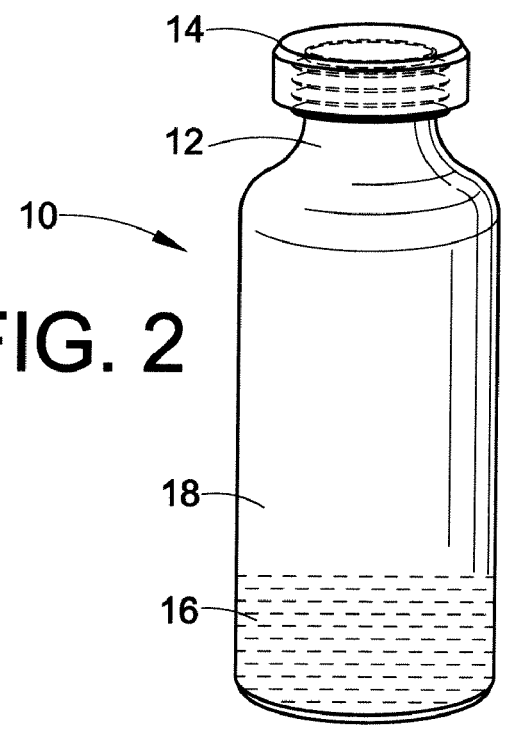
FIG. 2 is a perspective view of the resealable vial carrier of FIG. 1 shown in a sealed state and having a liquid amphiphilic material contained therein.
Figure 3:
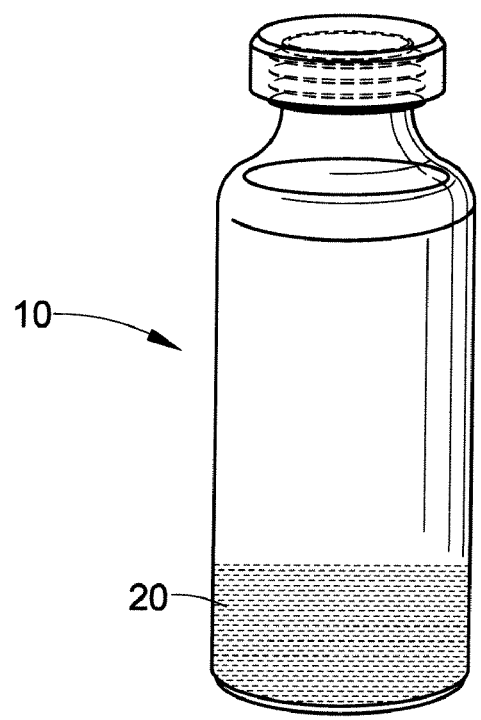
FIG. 3 is a perspective view of the resealable vial carrier of FIG. 1 having an amphiphilic solid material contained therein at a bottom of the vial carrier.

Now with reference to FIG. 1, a resealable container or vial carrier 10 for carrying an amphiphilic material is shown. The vial 10 includes a threaded neck portion 12 for receiving a threaded cap 14. The cap 14 may also include a hermetic seal comprising any pliable material suitable for making an air tight seal and which does not react with amphiphilic materials. For example, the seal could include rubber, silicone, polystyrene, or polytetrafluoroethylene (PTFE), more commonly known as Teflon®. With reference to FIG. 2, the vial 10 of FIG. 1 is shown having the threaded cap portion secured to the neck 12 of the vial and including an amphiphilic material 16 that is in a liquid state. An empty portion 18 of the vial 10 may include low pressure dry air or an inert gas such as dry nitrogen or argon. With respect to FIG. 3, the vial 10 of FIG. 1 is shown having an amphiphilic material 20 that is in the solid state. Upon heating of either the liquid amphiphilic material 16 or solid amphiphilic material 20, under vacuum in a chamber, the material will begin to vaporize. It should be noted that the vial or vial carrier 10 can be made from a glass or other heat conductive and temperature resilient material.

Figure 4:
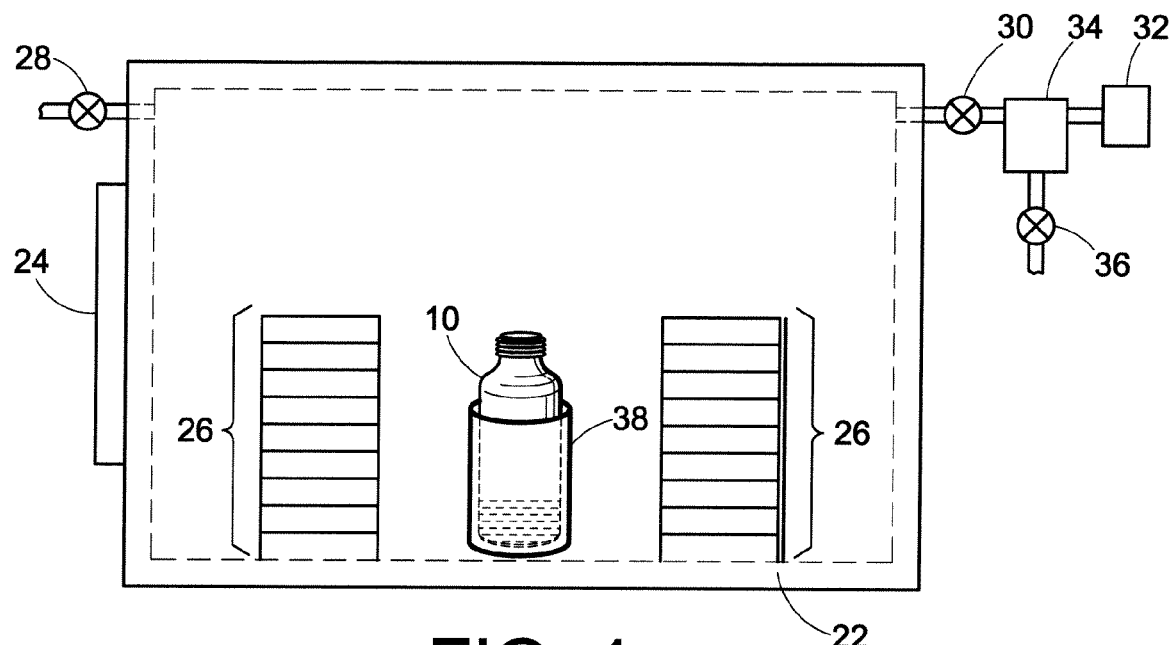
FIG. 4 is a schematic view of a low vacuum chamber coating arrangement using the resealable vial carrier of FIG. 2.

With reference to FIG. 4, a schematic diagram is shown of a low vacuum coating arrangement using the vial carrier 10 of the present invention. Generally, a vacuum chamber 22 is provided having a door 24 for inserting the vial 10 as well as one or more substrates 26. As described previously, the substrates may take the form of any article, such as a lens, display surface, laboratory glassware, or the like. The vacuum chamber further includes a vent valve 28 and a pump valve 30. During operation, the vent valve 28 is closed and the pump valve 30 is opened allowing a vacuum pump 32 to draw air from the vacuum chamber 22 out the pump valve 30 and through a trap 34 thereby creating a desired vacuum in the chamber. A trap valve 36 is also provided for emptying the contents that may be collected in the trap 34 during the evacuation process.

As described previously, the thin film coating process involves placing the one or more substrates 26 into the chamber 22 along with an opened resealable vial carrier 10 containing a liquid amphiphilic material into a heating element 38. The vacuum chamber 22 is then sealed by closing the door 24 and the valves 28. The pump valve 30 is opened and the vacuum pump 32 is activated. Once the desired vacuum pressure is achieved, the valve 30 is closed and the vial 10 is heated to the appropriate temperature, as described previously, allowing the amphiphilic material to vaporize and fill the vacuum chamber 22. At this point the amphiphilic molecules begin to deposit on the substrates 26. After a specified time has passed, the pump valve 30 is opened to remove excess vapors of amphiphilic material from the chamber 22 and then the vent valve 28 is opened to permit clean dry air to create atmospheric pressure within the vacuum chamber 22. Once this has occurred, the door 24 is opened and the substrates 26 are removed. Now, the resealable vial 10 may be removed and resealed by threading the cap portion back onto the vial.

Figure 5:
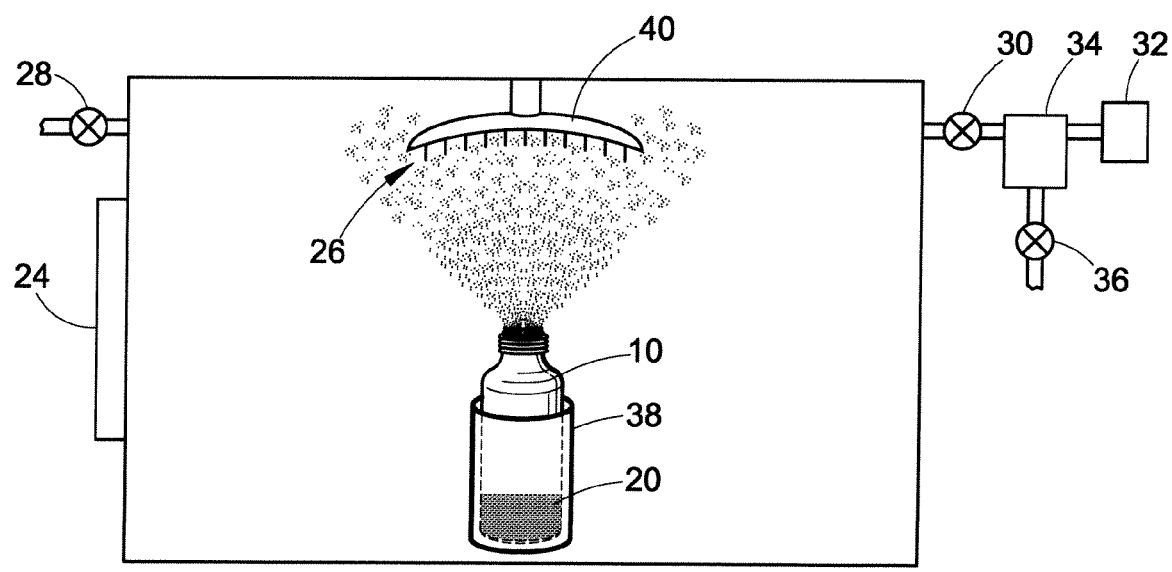
FIG. 5 is a schematic view of a high vacuum chamber coating arrangement having a rotating dome containing one or more substrates to be coated and using the resealable vial carrier of FIG. 3.

With reference to FIG. 5, a schematic view of a high vacuum coating arrangement is shown which employs many of the same elements shown in FIG. 4. However, the primary distinction between the low vacuum coating arrangement shown in FIG. 4 and the high vacuum coating arrangement shown in FIG. 5 involves the use of a rotating dome 40 carrying the substrates 26 for the purpose of producing a more controlled or directional type coating (also known as "V-coating"). Also, it should be noted that the vial carrier 10, shown in FIG. 5, shows the use of a solid amphiphilic material 20 as compared to the liquid amphiphilic material used in the low vacuum process of FIG. 4. The use of a solid amphiphilic material 20 is generally preferred in the case when high vacuum coating process is used to form the thin films on the substrates.

Figure 6:
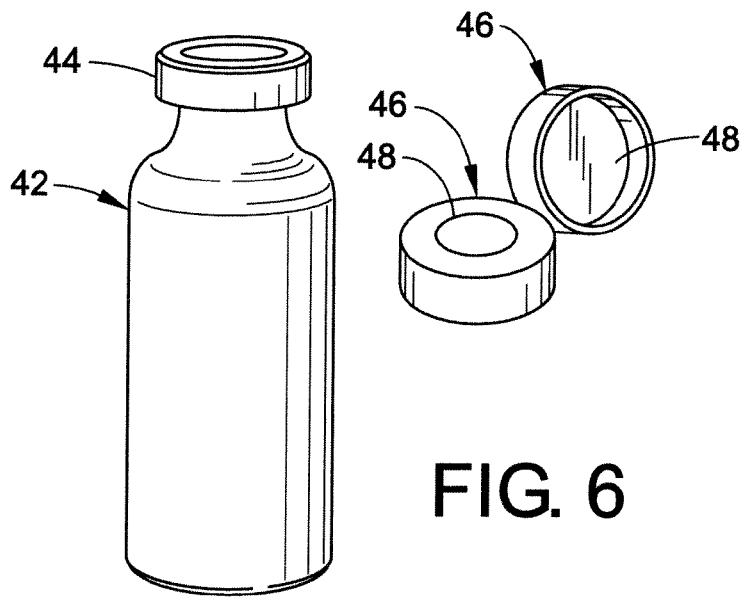
FIG. 6 is a perspective view of a second embodiment of a resealable container or vial carrier for use in a method of thin film formation, according to the present invention, having a crimp style neck portion and a crimp style sealing cap.
Figure 7:
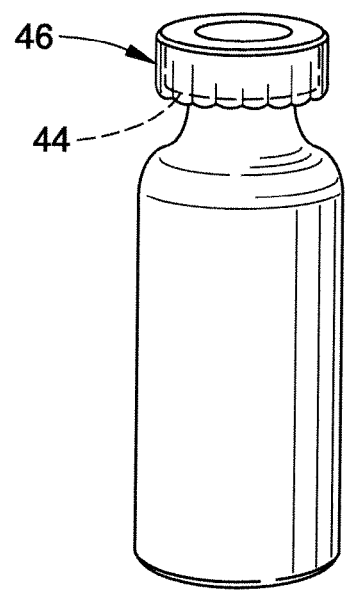
FIG. 7 is a perspective view of the resealable container or vial carrier of FIG. 1 with the crimp sealing cap installed thereon.
Figure 8:
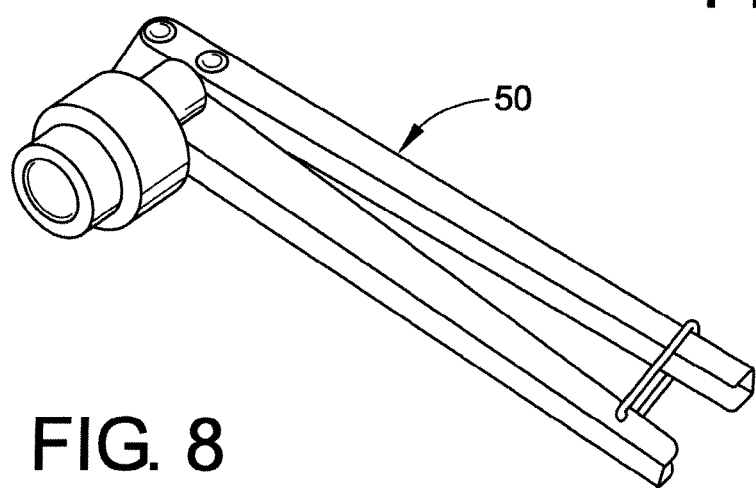
FIG. 8 is a perspective view of a crimping tool used to install the crimp sealing cap of FIGS. 6 and 7.

With reference to FIG. 6, a second embodiment of a resealable container or vial carrier 42 for use in a method of thin film formation is shown. The vial carrier 42 includes a crimp style neck portion 44 for receiving a crimp seal cap 46. The crimp cap 46 may be made of any appropriate metal or polymer based material for accepting a crimp. As with the first embodiment, the crimp cap 46 may include a PTFE seal 48 or other pliable septum. For example, the septum or seal 48 may also comprise rubber, silicon, or any other suitable sealing material. Once the crimp cap 46 is installed over the neck portion 44 (as shown in FIG. 7), the crimp cap 46 works in much the same manner as the threaded cap except that a crimping tool 50 (FIG. 8) or other device is typically required to create the hermetic seal rather than simply twisting it closed as in the case of the threaded cap. Of course, the crimp cap 46 may offer a better, longer term hermetic seal since the used crimped cap would be replaced with a new un-crimped seal cap after each use of the resealable vial.

Using a vial carrier containing a thin film forming amphiphilic material, a self-assembled and substantially continuous thin film of substantially uniform thickness can be efficiently formed on a substrate surface without damaging the substrate. In addition, an open vial containing the amphiphilic material constitutes an advantageous carrier for facilitating the vapor deposition of thin film on the substrate because it does not require a mechanical device to open the vial carrier inside the chamber. The resealable vial used in the invention could be made of different glass materials such as sodalime, borosilicate, quartz and a combination thereof. The vial could be clear, amber, green, blue or any other color. The size of the vial used in the invention could be from about 0.5-10 ml in volume. The outer diameter of vial could be from about 5-20 mm. To prepare the vial carrier to be used for thin film formation, the vial can be heated in a convection oven at 50-60° C. or more for 15-30 minutes to remove the moisture from inside the vial. While the vial is warm at 40-60° C., a known quantity of amphiphilic material measured by weight or volume is introduced in the vial and the vial is closed tightly with a cap containing a hermetic seal (e.g., a PTFE or any other pliable material). As the vial cools down, it creates a partial vacuum in the vial thereby drawing the hermetic seal even tighter and further protecting the amphiphilic material from ambient moisture. Optionally, the vial could be flushed with dry nitrogen or argon gas before and after the addition of the amphiphilic material and then closed with the cap, thereby creating an inert atmosphere inside the vial.

As used in the context of this invention, the thin film forming material includes amphiphilic molecules that are capable of self-assembling and or self-polymerizing into a thin film on a surface. The amphiphilic molecules have a polar reactive region (head group) and a non-polar, non-reactive region (tail group). The reactive polar group of the amphiphilic molecule can be a silane derivative, carboxylic acid, alcohols, thiols, primary, secondary and tertiary amines, cynide, sulfonate, phosponate, and the like. The non-polar group mainly contains alkyl, perfluoroalkyl, alkyl ether, perfluoroalkyl ether chains. The non-polar segment may also include polyalkyl ether or perfluorpolyether chains in linear or pendant structure, diacetylenes, vinylunsaturated alkyl, and fused or branched aromatic rings.

The amphiphilic molecules that can be used to form thin films according to the present invention include, but are not limited to: polymerizable amphiphilic molecules, hydrolyzable alkylsilanes, hydrolyzable perhaloalkylsilanes, perfluoroalkylethersilanes, perfluoropolyethersilanes, alkylchlorosilanes, polysiloxanes, alkylsilazanes, perfluoroalkylsilazanes, disilazanes, silsesquioxanes and polyhedral oligomeric silsesquioxanes.

In one embodiment, the amphiphilic molecules are represented by formula(I):

$$R_mSiZ_n \quad (I)$$

where R is an alkyl, fluorinated alkyl, an alkyl ether, or fluorinated alkyl ether containing from about 1-30 carbon atoms and most preferably 6-20 carbon atoms, substituted silane, or siloxane; Z is individually one of halogens, hydroxyl, alkoxy and acetoxy; and m is 1-3, n is 1-3, and m+n equal to 4. The alkyl chain may contain diacetylene, vinyl-unsaturated, single aromatics, or fused linear or branched aromatic rings.

In another embodiment, the amphiphilic molecule is represented by Formula (II):

$$R_mSH_n \quad (II)$$

where R is an alkyl, fluorinated alkyl, an alkyl ether or fluorinated alkyl ether chain containing about 1-30 carbon atoms and most preferably 6-20 carbon atoms; S is a sulfur; H is hydrogen; m is 1-2, n is 0-1, and m+n equal to 2. The alkyl chain may contain diacetylene, vinyl-unsaturated, single aromatics, or fused linear or branched aromatic rings.

In another embodiment, the amphiphilic molecule is represented by formula (III):

$$RY \quad (III)$$

where R is an alkyl, fluorinated alkyl, an alkyl ether or fluorinated alkyl ether cain containing 1-30 carbon atoms and most preferably 6-20 carbon atoms. Y is one of the following functional groups: —COOH, —SO$_3$H, —PO$_3$, —OH and —NH$_2$. The alkyl chain may contain diacetylene, vinyl-unsaturated, single aromatic, or fused linear or branched aromatic moieties.

In another embodiment, the amphiphilic molecule may be a disilazane represented by Formula (IV):

$$RSiNSiR \quad (IV)$$

where R is an alkyl, fluorinated alkyl, an alkyl ether or fluorinated alkyl ether containing about 1-30 carbon atoms and most preferably 6-20 carbon atoms.

In another embodiment, the amphiphilic molecule is represented by Formula (V):

$$R(CH_2CH_2O)_qP(O)_x(OH)_y \quad (V)$$

where R is an alkyl, fluorinated alkyl, an alkyl ether or fluorinated alkyl ether containing about 1-30 carbon atoms, q is 1-10, and x and y are independently 1-4.

In still yet another embodiment, the amphiphilic molecules, specifically polyhedral oligomeric silsesquioxanes (POSS), are represented by Formula (VI):

$$[R(SiO)_x(OH)_y] \quad (VI)$$

where R is an alkyl, fluorinated alkyl, an alkyl ether or fluorinated alkyl ether containing about 1-30 carbon atoms and most preferably 6-20 carbon atoms; x is 1-3 and y is 1-3. Such amphiphilic materials can be made by methods as described in U.S. Pat. Nos. 6,340,734; 6,284,908; 6,057,042; 5,691,396; 5,589,562; 5,422,223; 5,412,052; and J. Am. Chem. Soc. 1992,114, 6701-6710; J. Am. Chem. Soc. 1990,112, 1931-1936; Chem. Rev. 1995, 95, 1409-1430; and J. Am. Chem. Soc. 1997, 119, 3135-3143, which are hereby incorporated herein by reference.

Methods of applying thin films of amphiphilic molecules to different substrates having surfaces that are chemically reactive to amphiphilic molecules are described in the articles and U.S. patents incorporated by reference above. The method of the present invention allows application of thin film of amphiphilic materials on different substrates using the vial carrier. When these substrates are exposed to the vaporized gas phase amphiphilic molecules inside the vacuum chamber, the amphiphilic molecules self-assemble on the surface of the substrate to form a continuous and uniform thin film.

A vacuum chamber for use in the method of the present application may be an insulated rectangular metal box having a door. The door can be sealed by a gasket when closed and allow insertion and removal of substrates when open. The box may have an inside chamber that is in fluid communication with a vacuum pump capable of drawing a vacuum, as for example, $1 \times 10^{+2} - 5 \times 10^{-6}$ torr. Examples of low vacuum chambers include the DAS-1 and DAS-3 from Denton Vacuum, and high vacuum chambers available from Satis-Loh, Leybold Vacuum, Denton Vacuum and others.

The inside chamber in a low vacuum chamber can be equipped with separate heating devices for heating the chamber walls, and vaporizing the amphiphilic material. A number of different devices such as resistance electrodes, resistance heater, an induction coil, or an electron or laser beam can be used for rapidly heating the amphiphilic material to a high temperature for vaporization. A simple electric heating block could also be used for this purpose.

The substrate to be coated with a thin film is placed inside the chamber, in a suitable position. The cap of the vial carrier having liquid amphiphilic material is opened by hand and placed in the heating device inside the chamber and the chamber door is closed. A strong vacuum between $2 \times 10^{+2}$ and $5 \times 10^{-4}$ torr is optionally applied to the chamber. Now the valve connected between the chamber and the pump is closed to keep the chamber at constant desired vacuum. The vial carrier containing the amphiphilic material is heated to vaporize the material. The gas phase amphiphilic molecules spread very quickly and uniformly throughout the whole chamber. The chamber is kept in this condition for a time of 20 seconds to 30 minutes. During this time the amphiphilic molecules self-assemble and attach to the surface of the substrate and form a continuous and uniform thin film.

After the selected time, the vacuum pump valve is opened to evacuate the excess gas phase amphiphilic material from the chamber. A cold trap or condenser between the chamber and the pump condenses and traps the excess amphiphilic material vapors and does not allow it to go to the pump or escape to the atmosphere. Now clean dry air is let into the chamber to bring it up to atmospheric pressure and the chamber is opened to remove the coated substrates as well as the vial. If some amphiphilic material is left over or not vaporized completely, the vial carrier could be resealed with the screw cap for reuse in the next coating process.

The substrates may be coated at chamber temperatures between 20-100° C. and more preferably between 30-50° C. The amount of amphiphilic material used may be from $(1-100) \times 10^{-2}$ mmole per cubic foot of chamber volume. The glass vial carrier size could be about 0.5-5 ml. The self-assembled thin film molecules coated by the above process are covalently bonded to the surface, thus providing a permanent transparent uniform thin film of 2-20 nm in thickness, which is resistant to many chemical and environmental drastic conditions and retains its intrinsic properties.

A number of different substrates such as glass, ceramic, porcelain, metals, plastics, silicon wafers, mirrors and anti-reflective surfaces can be coated with a thin film using vial carrier in the above process. The thin film provides several properties on these surfaces including scratch resistance, protection of anti-reflective surfaces on eyewear lenses, moisture barrier, friction reduction, stain resistance, finger print resistance, water repellent and easy clean.

In one example, anti-reflective eyeglass lenses having a last layer silica coating and pre-exposed to moisture in clean ambient air are placed inside the vacuum chamber. A vial carrier containing $(1-300) \times 10^{-2}$ mmole, preferably $(1-100) \times 10^{-2}$ mmole and most preferably $(2-10) \times 10^{-2}$ mmole of amphiphilic material $R_m SiZ_n$ per cubic foot of the vacuum chamber volume, is uncapped by hand and placed in the heating device in the chamber. With the vacuum chamber door sealed, a vacuum $2 \times 10^{-2}$ torr. is then applied to the chamber. The pump valve is closed to keep the chamber and the lenses at low pressure. The vial carrier containing the amphiphilic material is heated at 200-250° C. for 30 seconds to a minute to completely vaporize the material. The chamber is kept under these conditions for 30 seconds. The vacuum pump valve is then opened and the chamber is evacuated to remove the excess gaseous film forming material. The chamber is then filled with clean dry air to bring it to atmospheric pressure and the door is opened for removing the lenses coated with a permanent hydrophobic thin film of amphiphilic molecules. The completely empty vial is also taken out.

In a second example, glass lenses (such as sunglasses) are placed inside the vacuum chamber. A vial carrier containing the coating material $(1-100) \times 10^{-2}$ mmole as mentioned above is opened by hand and put in the heating unit inside the chamber. The chamber door is closed and a vacuum of $2 \times 10^{-2}$ torr is applied. The pump valve is closed and the amphiphilic material is vaporized by heating the vial carrier at 175-200° C. for 30 seconds. The chamber is kept under these conditions for 30 seconds followed by evacuation of the excess gaseous material by opening the pump valve. The chamber is then filled with clean dry air to bring it to atmospheric pressure and the door is opened to remove the coated sunglasses now having a permanent transparent hydrophobic thin film of amphiphilic molecules on the surface. The vial carrier is also removed which in this example may contain nearly half of the amphiphilic material that is not vaporized. The vial carrier while still warm is immediately resealed with the hermetic seal screw cap and could be used again, as in the next example.

In a third example, plastic lenses made of resins such as CR-39® (trade name of PPG, Ind.), polycarbonate and high index resins, coated with scratch resistant hard coat, are placed inside the vacuum chamber. Also, the resealable vial carrier containing the amphiphilic material from the previous example is hand opened and placed in the heating unit in the vacuum chamber. After applying the vacuum at $2 \times 10^{-2}$ torr, the pump valve is closed and the gas phase amphiphilic material is released into the chamber by quickly heating the amphiphilic material for 10-20 minutes followed by evacuation of the excess gaseous material from the chamber by opening the pump valve. Lastly, the chamber is filled with clean dry air and the plastic lenses coated with hydrophobic thin film of amphiphilic molecules are removed. In this example, all lenses had excellent thin film coating on the surface, thereby proving the reusability of the resealed vial carrier.

In a fourth example, clean silicon wafers are placed inside the chamber and an open vial carrier containing amphiphilic material of example one is placed in the heating device in the chamber. A vacuum of $2 \times 10^{-2}$ torr was applied to the chamber, pump valve is closed and the amphiphilic material vaporized by heating the vial at 200-250° C. temperature. The silicon wafers are exposed to the gaseous material for one minute followed by evacuation and clean dry air fill. The wafers, now coated with high quality hydrophobic thin film of amphiphilic molecules, are removed from the chamber.

In a fifth example, laboratory ware such as glass beakers, Erlenmeyer flasks and glass cookware such as dishes, bowls are placed inside the vacuum chamber and an open vial carrier containing the amphiphilic material as above is also placed in the heating device. After closing the door, a vacuum of $2 \times 10^{-2}$ torr is applied to the chamber and the amphiphilic material is vaporized by heating the vial. After waiting for 30 seconds to one minute, the excess vapors are evacuated and the chamber is filled with clean dry air to permit opening of the chamber door. Both the inside as well as the outside surfaces of all the glassware and cookware were coated with hydrophobic thin film of amphiphilic molecules, resulting in the surfaces having a water repellent and non-stick property.

In a sixth example, industrial plastic sheets coated with anti-reflective film, such as a touch screen face plate, cell phone windows, instrument display windows are coated successfully with the hydrophobic thin film of amphiphilic molecule using the vial carrier and the above process.

In a seventh example, a number of polished metals such as gold, silver and copper, are placed in the chamber with a vial carrier containing amphiphilic material $R_mSH_n$. The process is used as described above. After the process, the metal surfaces are coated well with the hydrophobic thin film of amphiphilic molecules.

In an eighth example, plastic lenses coated with hard coat are placed in a high vacuum coating chamber on a rotating dome as shown in FIG. 5. A vial carrier containing a solid alkylsilsesquioxane amphiphilic material is also placed under the dome in a heating device. A very high vacuum in the range of $(1-5) \times 10^{-5}$-$10^{-6}$ torr is applied to the chamber and the lenses are coated with AR film using the known multi-layer anti-reflective coating process, ending in the silica layer as the last layer on the lens surface. The vacuum in the chamber is then raised to $10^{-4}$-$10^{-5}$ torr by bleeding clean dry air. While the vacuum is on, the vial containing the solid alkylsilsesquioxane amphiphilic material is heated at 250-350° C. temperature and vapors of the material are released in the chamber. The vapors then reach to the rotating lenses at the top dome and solidify in a thin film on the lenses. The thickness of the film deposited on lens surface is controlled by the rate of heating of the vial carrier and time and checked by the electronic analytical balance attached next to the upper dome. A thin film of 10-15 nm thickness is applied on the lenses with in 10-20 seconds. The vacuum pump valve attached to the chamber is closed and the clean dry air is filled in the chamber to bring it to atmospheric pressure. Now the lenses coated with hydrophobic thin film are taken out.

In yet another experiment the solid amphiphilic material in the vial carrier, as in example eighth, was partially vaporized to coat the substrates in the chamber and the leftover solid material in the vial was immediately resealed with screw cap for next use. The resealed vial carrier containing the leftover amphiphilic material was successfully used in the high vacuum chamber again to coat the substrates with good quality hydrophobic thin film thereon.

It should be noted that in one aspect of the present invention, a glass vial assembly is provided containing a glass vial with a threaded neck and a thin film forming liquid amphiphilic material disposed inside the vial. The vial can be tightly closed with a screw cap having a liner seal such as PTFE or any other pliable material. This assembly will herein be referred to also as a "vial carrier". As described previously, the liner seal inside the cap hermetically seals the vial preventing the thin film amphiphilic material from being exposed to moisture in the ambient air. The vial carrier may be used in methods and systems, such as vacuum chambers for forming thin film on substrates.

To deliver the thin film forming material in a vacuum chamber, the screw cap is opened by hand and the vial carrier containing the thin film amphiphilic material is placed in the heating unit inside the vacuum chamber. Since the open vial carrier is used to deliver the amphiphilic material to the vacuum chamber, damage to substrate is mitigated while vapors of amphiphilic material are uniformly distributed in the whole chamber. Also, thick walls of the glass vial promote uniform heating and continuous vaporization of the amphiphilic material. Thus, no splashing of the thin film forming material occurs on the substrate surface and no final inspection or cleaning of substrate is required. As a result, the thin film formed on the substrate using the vial carrier of the present invention is uniform and continuous in nature with little or no pinholes.

A complete or partial vaporization of the amphiphilic material in the glass vial carrier in the vacuum chamber is controlled by the time and the temperature to which the vial carrier is heated. If only a partial vaporization is desired, the remaining amphiphilic material in the glass vial can be resealed with the screw cap and kept for the next use. Alternatively, in the case of a complete vaporization of the amphiphilic material, the clean empty glass vial can be reused and recharged with new amphiphilic material and sealed with the screw cap. Substrates such as anti-reflective (AR) lenses that are already exposed to water vapors in clean ambient air are coated in this manner. Other substrate surfaces such as glass, metals, ceramics, porcelain, mirrors and silicon wafers could also be coated with thin films using the vial carrier of the present invention.

In another arrangement of the invention, the glass vial is charged with a solid polymeric amphiphilic material such as polysilsesqioxanes and the open vial is heated in an oven at 50-100° C. to melt the solid material. The vial is then cooled to 40-60° C. and sealed tightly with the hermetic seal screw cap. As the vial cools down, the melted polymeric material solidifies at the bottom of the vial and a slight vacuum is created inside the vial. Then, to apply a thin film of the polymeric amphiphilic material on substrates in a high vacuum chamber, the cap of the vial carrier having solid polymeric amphiphilic material is opened by hand and placed in a heating unit inside the chamber. The polymeric amphiphilic material is vaporized and distributed in the chamber by heating the vial at reduced pressure inside the chamber and thereby coating the substrate. Here again, the amphiphilic material in the vial carrier could be vaporized partially or completely.

These two arrangements evidence that the vial carrier is versatile enough to be used with liquid or solid amphiphilic materials in low or high vacuum coating chambers. Also the vial carrier could be resealed with amphiphilic material in it and could be reused in the coating process. It should also be noted that a further objective of the invention is to have a thin film forming material carrier that does not need to be broken open inside the vacuum chamber during coating process. Yet another objective of the invention to is to provide a thin film forming material carrier that does not damage the substrate inside vacuum chamber due to broken pieces. It is still another objective of the invention to have a thin film forming material carrier that does not have any pressure difference between inside the carrier and the inside of the vacuum chamber. Still yet another objective of the invention is to have a thin film material carrier that is versatile enough and can be used with liquid or solid thin film forming amphiphilic materials. Further still, another objective of the invention is to have a thin film material carrier that could be used multiple times inside a vacuum chamber to dispense the material. Lastly, it would be yet another objective of the invention to have a thin film material carrier that is easy to produce and can be used inside a low or high vacuum coating chamber.

It will be appreciated that a variety of the above-disclosed and other features and functions, or alternatives thereof, may be desirably combined into many other systems or applications. Also, various presently unforeseen or unanticipated alternatives, modifications, variations or improvements therein may be subsequently made by those skilled in the art which are also intended to be encompassed by the following claims.

The invention claimed is:

1. A method of forming a thin film of amphiphilic molecules on a substrate by using a resealable vial carrier, the method comprising the steps of:
    placing the substrate in a vacuum chamber;
    opening a resealable cap member of the vial carrier, the vial carrier containing a liquid polymeric amphiphilic material;
    placing the open vial carrier within the chamber;
    sealing the chamber and applying at least a pressure from about $2\times10^{+2}$ to $5\times10^{-4}$ torr to the chamber;
    heating the vial carrier to a temperature between 100-350° C.;
    vaporizing the amphiphilic material in the chamber;
    forming a thin film of amphiphilic molecules on the substrate; and
    opening the chamber and removing the substrate having the thin film of amphiphilic molecules thereon.

2. The method of claim 1, further comprising the step of resealing the resealable cap member of the vial carrier after forming the thin film of amphiphilic molecules on the substrate.

3. The method of claim 2, wherein the steps of opening and resealing the resealable cap member includes twisting a threaded cap at an opening of the vial carrier.

4. The method of claim 2, wherein the step of resealing further comprises displacing the gaseous contents of the vial carrier with an inert gas.

5. The method of claim 2, wherein the steps of opening the resealable cap member includes removing a crimped seal from the vial carrier.

6. The method of claim 5, wherein the steps of resealing the resealable cap member includes crimping a hermetic seal at an opening of the vial carrier after forming the thin film of amphiphilic molecules on the substrate.

7. The method of claim 6, wherein the step of resealing further comprises displacing the gaseous contents of the vial carrier with an inert gas.

8. The method of claim 1, wherein the resealable vial carrier includes less than 5 grams by weight of a heat vaporizable amphiphilic material.

9. The method of claim 1, wherein the outer diameter of the resealable vial carrier is 5-20 mm.

10. The method of claim 1, wherein the resealable cap member includes threads and a pliable hermetic seal for engaging a threaded neck disposed about the opening of the vial carrier.

11. The method of claim 10, wherein the hermetic seal includes one of a pliable polytetrafluoroethelyne (PTFE), silicone, rubber, or polystyrene material.

12. A method of forming a thin film of amphiphilic molecules on a substrate by using a resealable vial carrier, the method comprising the steps of:
    placing the substrate in a high vacuum chamber;
    opening a resealable cap member of the vial carrier containing a solid polymeric amphiphilic material;
    placing the open vial carrier within the chamber;
    sealing the chamber and forming a metal oxide coating on the substrate in the chamber;
    applying at least a pressure from about $2\times10^{+2}$ to $2\times10^{-6}$ torr to the chamber;
    heating the vial carrier to a temperature between 100-350° C.;
    vaporizing the solid amphiphilic material in the chamber;
    forming a thin film of amphiphilic molecules on the substrate; and
    opening the chamber and removing the substrate having the thin film of amphiphilic molecules thereon.

13. The method of claim 12, further comprising the step of resealing the resealable cap member of the vial carrier after forming the thin film of amphiphilic molecules on the substrate.

14. The method of claim 13, wherein the steps of opening and resealing the resealable cap member includes twisting a threaded cap at an opening of the vial carrier.

15. The method of claim 14, wherein the step of resealing further comprises displacing the gaseous contents of the vial carrier with an inert gas.

16. The method of claim 14, wherein the steps of opening the resealable member includes removing a crimped seal.

17. The method of claim 13, wherein the steps of resealing the resealable member includes crimping a hermetic seal at an opening of the vial carrier after forming the thin film of amphiphilic molecules on the substrate.

18. The method of claim 17, wherein the step of resealing further comprises displacing the gaseous contents of the vial carrier with an inert gas.

19. A method of forming a thin film of amphiphilic molecules on a substrate to be coated by using a high temperature and vacuum resistant resealable vial carrier for carrying a polymeric amphiphilic material to be vaporized, the method comprising:
    placing the substrate to be coated in a high vacuum chamber;
    opening a cap member of the high temperature and vacuum resistant vial carrier containing the polymeric amphiphilic material;
    placing the open resealable vial carrier within the chamber;
    sealing the chamber and forming a metal oxide coating on the substrate in the chamber;
    applying at least a pressure from about $2\times10^{+2}$ to $2\times10^{-6}$ torr to the chamber;
    heating the open resealable vial carrier to a temperature between 100-350° C.;

vaporizing the polymeric amphiphilic material in the chamber;

forming the thin film of amphiphilic molecules on the substrate;

opening the chamber and removing the coated substrate having the thin film of amphiphilic molecules thereon;

displacing a gaseous content of the open resealable vial carrier with an inert gas; and resealing the resealable vial carrier and preserving any unused polymeric amphiphilic material contained therein for future use.

20. The method of claim 19, wherein the resealable vial carrier includes less than 5 grams by weight of a heat vaporizable polymeric amphiphilic material.

21. The method of claim 19, wherein the outer diameter of the resealable vial carrier is 5-20 mm.

22. The method of claim 19, wherein opening the cap member includes removing a crimped seal from the vial carrier and resealing the vial carrier includes crimping a hermetic seal at an opening of the vial carrier.

23. The method of claim 19, wherein the cap member is resealable and includes internally disposed threads and a pliable hermetic seal for engaging a threaded neck disposed about an opening of the vial carrier.

24. The method of claim 23, wherein the hermetic seal includes one of a pliable polytetrafluoroethelyne (PTFE), silicone, rubber, or polystyrene material.

* * * * *